(12) United States Patent
Kim (10) Patent No.: US 11,469,188 B2
(45) Date of Patent: Oct. 11, 2022

(54) SEMICONDUCTOR PACKAGE (71) Applicant: Samsung Electronics Co., Ltd., Suwon-si (KR)

(72) Inventor: Geunwoo Kim, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 76 days.

(21) Appl. No.: 17/162,444

(22) Filed: Jan. 29, 2021

(65) Prior Publication Data
US 2021/0391280 A1 Dec. 16, 2021

(30) Foreign Application Priority Data
Jun. 16, 2020 (KR) .................. 10-2020-0072689

(51) Int. Cl.
H01L 23/00 (2006.01)
H01L 25/065 (2006.01)
H01L 23/31 (2006.01)
H01L 23/538 (2006.01)

(52) U.S. Cl.
CPC ............ *H01L 23/562* (2013.01); *H01L 23/31* (2013.01); *H01L 23/5386* (2013.01); *H01L 24/14* (2013.01); *H01L 25/0657* (2013.01)

(58) Field of Classification Search
CPC .. H01L 25/072; H01L 21/4853; H01L 21/565
See application file for complete search history.

(56) References Cited

U.S. PATENT DOCUMENTS

| 5,909,057 | A | 6/1999 | McCormick et al. |
| 6,002,171 | A | 12/1999 | Desai et al. |
| 8,319,961 | B2 * | 11/2012 | Ryu ................ G01N 21/95684 356/237.1 |
| 8,624,348 | B2 | 1/2014 | Mohammed |
| 8,810,025 | B2 * | 8/2014 | Liu ...................... H01L 23/562 257/702 |
| 2002/0159242 | A1 * | 10/2002 | Nakatani ............ H01L 23/3107 29/841 |

(Continued)

FOREIGN PATENT DOCUMENTS

JP 2013-0012570 1/2013
JP 2017-0130521 1/2016

(Continued)

*Primary Examiner* — Thao P Le
(74) *Attorney, Agent, or Firm* — Harness, Dickey & Pierce, P.L.C.

(57) ABSTRACT

A semiconductor package may include a package substrate, a molded interposer package (MIP) and a first stiffener. The MIP may be arranged on the package substrate. The MIP may include an interposer, at least one first semiconductor chip and at least one second semiconductor chip molded by a molding member. The first stiffener may be attached to any one of outer surfaces of the MIP. The first stiffener may be spaced apart from the upper surface of the package substrate to suppress a warpage of the MIP. Thus, central conductive bumps between the MIP and the package substrate may not be upwardly floated to improve an electrical connection between the central conductive bumps and the package substrate. Further, a short between edge conductive bumps between the MIP and the package substrate may not be generated.

20 Claims, 7 Drawing Sheets (56) References Cited

U.S. PATENT DOCUMENTS

| | | | |
|---|---|---|---|
| 2004/0259326 A1* | 12/2004 | Hideo | G02F 1/136277 |
| | | | 438/458 |
| 2006/0063312 A1* | 3/2006 | Kurita | H01L 21/563 |
| | | | 257/E23.129 |
| 2010/0144096 A1* | 6/2010 | Koroku | H01L 21/561 |
| | | | 257/E21.508 |
| 2010/0295178 A1* | 11/2010 | Ishihara | H01L 25/162 |
| | | | 257/737 |
| 2014/0104411 A1 | 4/2014 | Ryu et al. | |
| 2021/0118757 A1* | 4/2021 | Lin | H01L 23/3185 |
| 2022/0028773 A1* | 1/2022 | Lu | H01L 23/5385 |
| 2022/0068736 A1* | 3/2022 | Lo | H01L 25/105 |
| 2022/0069100 A1* | 3/2022 | Hwang | H01L 29/66795 |
| 2022/0093543 A1* | 3/2022 | Seo | H01L 24/81 |

FOREIGN PATENT DOCUMENTS

| | | |
|---|---|---|
| KR | 1429723 | 6/2010 |
| KR | 1440342 | 9/2012 |

* cited by examiner

SEMICONDUCTOR PACKAGE

CROSS-RELATED APPLICATION

This application claims priority under 35 USC § 119 to Korean Patent Application No. 10-2020-0072689, filed on Jun. 16, 2020 in the Korean Intellectual Property Office (KIPO), the contents of which are herein incorporated by reference in their entirety.

BACKGROUND

1. Field

Example embodiments relate to a semiconductor package. For example, at least some example embodiments relate to a 2.5D stack type semiconductor package including an interposer.

2. Description of the Related Art

Generally, a 2.5D stack type semiconductor package may include a package substrate, an interposer, an application specific integrated circuit (ASIC) chip, memory chips and a molding member. The ASIC chip and the memory chips may be arranged on an upper surface of the interposer. The molding member may be configured to surround side surfaces of the ASIC chip, the memory chips and the interposer.

Conventionally, when a molded interposer package (MIP) including the ASIC chip, the memory chips and the interposer molded by the molding member are bonded to the package substrate via conductive bumps at a high temperature, the MIP may be bent. This may cause floating of central conductive bumps among the conductive bumps so that the central conductive bumps may not be connected to the package substrate. Further, a short between edge conductive bumps among the conductive bumps may be generated.

SUMMARY

Example embodiments provide a semiconductor package that may be capable of suppressing a warpage of an MIP.

According to example embodiments, there may be provided a semiconductor package. The semiconductor package may include a package substrate, an interposer, at least one application specific integrated circuit (ASIC) chip, a plurality of memory chips, a molding member and first stiffeners. The interposer may be on an upper surface of the package substrate. The ASIC chip may be on at least a central portion of an upper surface of the interposer. The plurality of memory chips may be on at least edge portions of the upper surface of the interposer at both sides of the ASIC chip in a first direction. The molding member may include first molding portions, second molding portions and third molding portions, the first molding portions extending in the first direction to contact first outer surfaces of the ASIC chip, the memory chips and the interposer, the second molding portions extending from ends of the first molding portions in a second direction substantially perpendicular to the first direction to contact second outer surfaces of the memory chips and the interposer, and the third molding portions extending between the ASIC chip and the memory chips. The first stiffeners may be attached to an outer surface of the first molding portions and spaced apart from the upper surface of the package substrate, the first stiffeners configured to suppress a warpage of the ASIC chip, the memory chips and the molding member along the first direction with respect to the third molding portions, wherein each of the first stiffeners has a length in the first direction substantially same as a length of the outer surface of the first molding portions, a length in the second direction substantially same as a length of the package substrate exposed from the ASIC chip and the molding member, and a thickness substantially same as a thickness of the molding member.

According to example embodiments, there may be provided a semiconductor package. The semiconductor package may include a package substrate, an interposer, at least one first semiconductor chip, a plurality of second semiconductor chips, a molding member and first stiffeners. The may be interposer on an upper surface of the package substrate. The at least one first semiconductor chip may be on at least a central portion of an upper surface of the interposer. The plurality of second semiconductor chips may be on at least edge portions of the upper surface of the interposer at both sides of the first semiconductor chip in a first direction. The molding member may include first molding portions, second molding portions and third molding portions, the first molding portions extending in the first direction to contact first outer surfaces of the first semiconductor chip, the second semiconductor chips and the interposer, the second molding portions extending from ends of the first molding portions in a second direction substantially perpendicular to the first direction to contact second outer surfaces of the second semiconductor chips and the interposer, and the third molding portions extending between the first semiconductor chip and the plurality of second semiconductor chips. The first stiffeners may be attached to outer surfaces of the first molding portions and spaced apart from the upper surface of the package substrate, the first stiffeners including a material having a strength stronger than strengths of the first and second semiconductor chips such that the first stiffeners are configured to suppress a warpage of the first semiconductor chip, the second semiconductor chips and the molding member along the first direction with respect to the third molding portions.

According to example embodiments, there may be provided a semiconductor package. The semiconductor package may include a package substrate, a molded interposer package (MIP) and a first stiffener. The MIP may be on the package substrate and may include an interposer, at least one first semiconductor chip and at least one second semiconductor chip molded by a molding member. The first stiffener may be attached to at least one of outer surfaces of the MIP. The first stiffener may be spaced apart from an upper surface of the package substrate to suppress a warpage of the MIP.

According to example embodiments, the first stiffener may be attached to facing side surfaces of the molding member and spaced apart from the upper surface of the package substrate to suppress the warpage of the MIP with respect to the third molding portion in a process for bonding the MIP to the package substrate at a high temperature. Thus, central conductive bumps between the MIP and the package substrate may not be upwardly floated to improve an electrical connection between the central conductive bumps and the package substrate. Further, a short between edge conductive bumps between the MIP and the package substrate may not be generated.

BRIEF DESCRIPTION OF THE DRAWINGS

Example embodiments will be more clearly understood from the following detailed description taken in conjunction with the accompanying drawings. FIGS. 1 to 12 represent non-limiting, example embodiments as described herein.

DETAILED DESCRIPTION

Hereinafter, example embodiments will be explained in detail with reference to the accompanying drawings.

Figure 1:
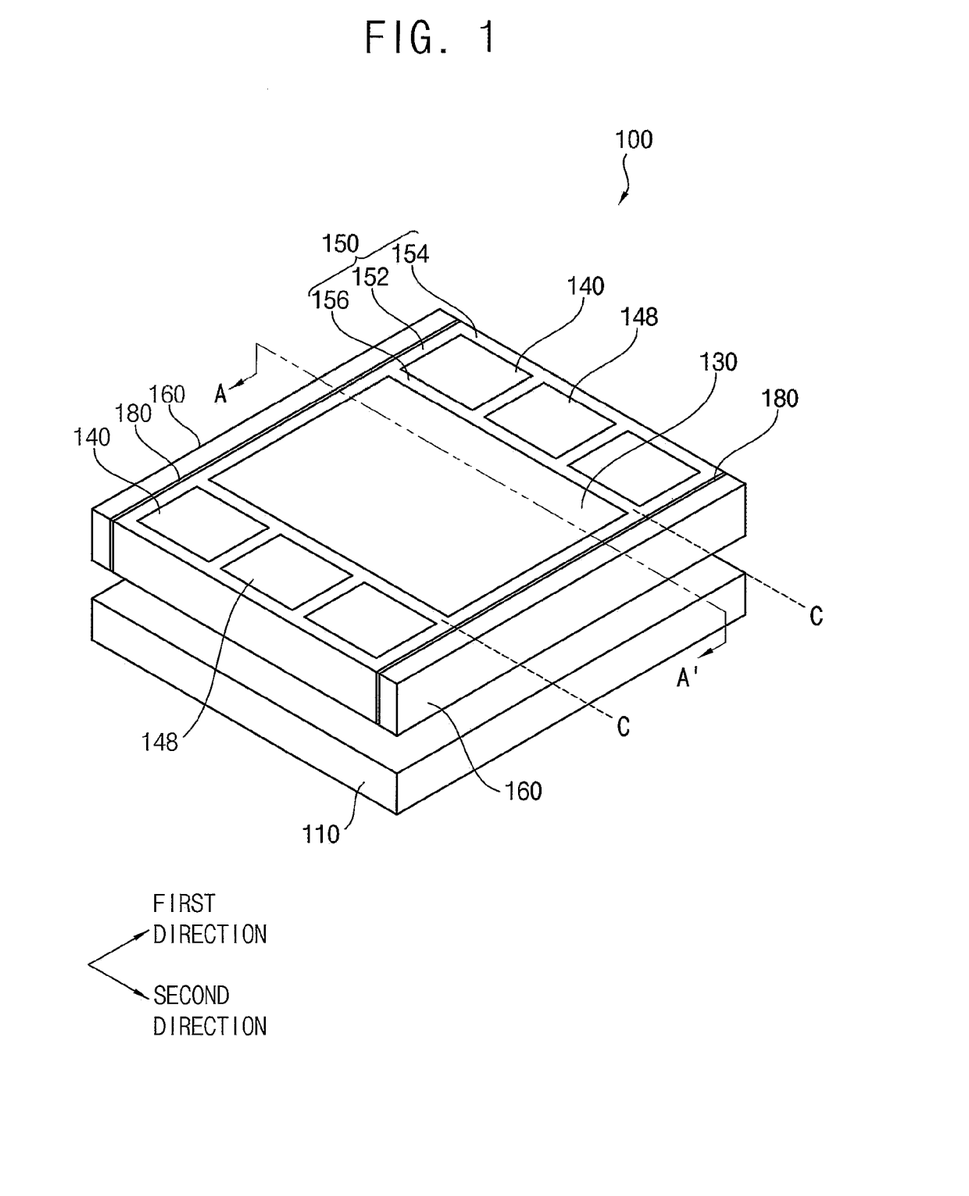
FIG. 1 is a perspective view illustrating a semiconductor package in accordance with example embodiments.
Figure 2:
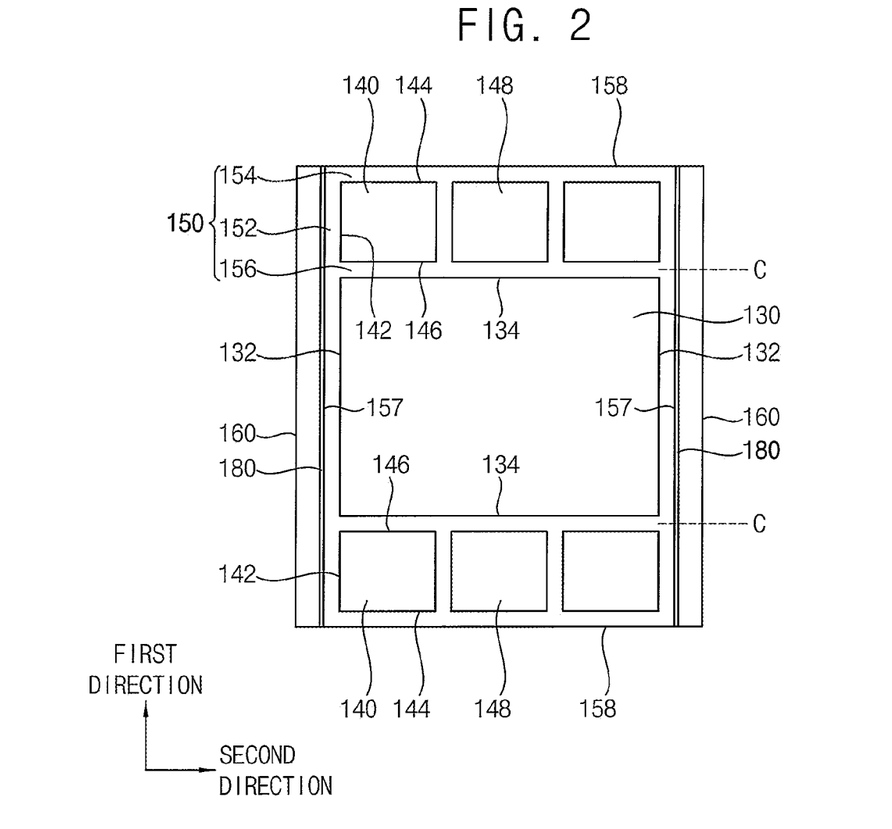
FIG. 2 is a plan view illustrating the semiconductor package in FIG. 1.
Figure 3:
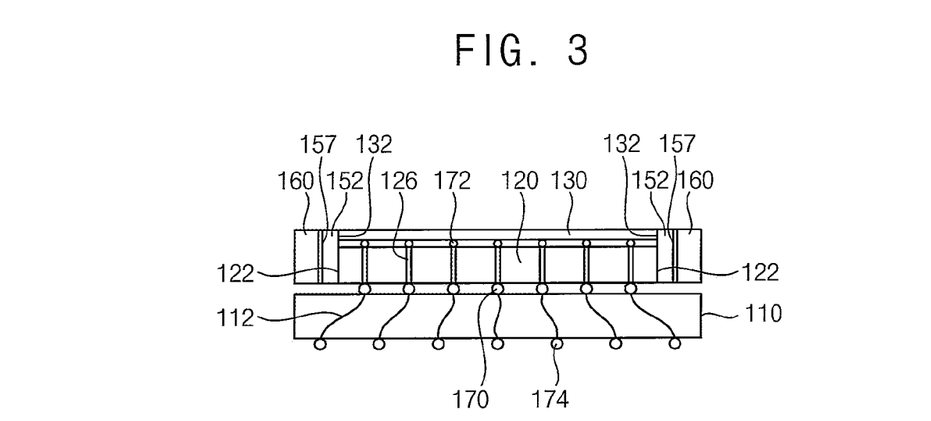
FIG. 3 is a cross-sectional view taken along a line A-A' in FIG. 1.

FIG. 1 is a perspective view illustrating a semiconductor package in accordance with example embodiments, FIG. 2 is a plan view illustrating the semiconductor package in FIG. 1, and FIG. 3 is a cross-sectional view taken along a line A-A' in FIG. 1.

Referring to FIGS. 1 to 3, a semiconductor package 100 of example embodiments may include a 2.5D stack type semiconductor package.

The 2.5D stack type semiconductor package may include multiple die inside a same package the dies being side-by-side on an interposer instead of stacking them vertically in a three-dimensional (3D) integrated circuit. By placing the dies side-by-side instead of stacking them, heat buildup may be reduced and upgrading or modifying the package may be faster and simpler than reworking a 3D integrated circuit.

The 2.5D stack type semiconductor package may include a package substrate 110, an interposer 120, at least one first semiconductor chip 130, second semiconductor chips 140, a molding member 150 and a first stiffener 160.

The package substrate 110 may have a rectangular parallelepiped shape. The package substrate 110 may include an insulation substrate, a plurality of upper pads, a plurality of lower pads and a conductive pattern 112. The upper pads may be arranged on an upper surface of the insulation substrate. The lower pads may be arranged on a lower surface of the insulation substrate. The conductive patterns 112 may be formed in the insulation substrate to electrically connect the upper pads and the lower pads with each other. External terminals 174 may be mounted on the lower pads of the package substrate 110.

A structure including the interposer 120, the first semiconductor chip 130 and the second semiconductor chips 140 molded by the molding member 150 may be referred to as a molded interposer package (MIP). The MIP may have a rectangular parallelepiped shape having a size smaller than a size of the package substrate 110. Thus, an edge portion of the upper surface of the package substrate 110 may be upwardly exposed. Hereinafter, a first direction may indicate a long axial direction of the MIP. A second direction substantially perpendicular to the first direction may indicate a short axial direction of the MIP.

The interposer 120 may be arranged on the upper surface of the package substrate 110. The interposer 120 may include conductive posts 126 in the interposer 120. The interposer 120 may be electrically connected with the package substrate 110 via first conductive bumps 170. That is, the first conductive bumps 170 may be arranged between the interposer 120 and the package substrate 110 to electrically connect the conductive posts 126 of the interposer 120 with the upper pads of the package substrate 110.

In example embodiments, the interposer 120 may have a rectangular parallelepiped shape having a size smaller than the size of the package substrate 110. Thus, the interposer 120 may have first outer surfaces 122 extended in the first direction and second outer surfaces extended in the second direction. Particularly, the first outer surfaces 122 of the interposer 120 may have a length longer than a length of the second outer surfaces of the interposer 120.

The first semiconductor chip 130 may be arranged on a central portion of an upper surface of the interposer 120. The first semiconductor chip 130 may be electrically connected with the interposer 120 via second conductive bumps 172. That is, the second conductive bumps 172 may be interposed between the first semiconductor chip 130 and the interposer 120 to electrically connect the conductive posts 126 of the interposer 120 with the first semiconductor chip 130. In example embodiments, the first semiconductor chip 130 may include an application specific integrated circuit (ASIC) chip.

In example embodiments, the first semiconductor chip 130 may have a rectangular parallelepiped shape having a size smaller than the size of the interposer 120. Thus, the first semiconductor chip 130 may have first outer surfaces 132 extended in the first direction and second outer surfaces 134 extended in the second direction. Particularly, the first outer surfaces 132 of the first semiconductor chip 130 may be positioned on a vertical plane substantially coplanar with a vertical plane on which the first outer surfaces 122 of the interposer 120 may be positioned. Alternatively, the first outer surfaces 132 of the first semiconductor chip 130 may be positioned further inside than the first outer surfaces 122 of the interposer 120.

The second semiconductor chips 140 may be arranged on an edge portion of the upper surface of the interposer 120. The second semiconductor chips 140 may be electrically connected with the interposer 120 via the second conductive bumps 172. That is, the second conductive bumps 172 may be interposed between the second semiconductor chips 140 and the interposer 120 to electrically connect the conductive posts 126 of the interposer 120 with the second semiconductor chips 140.

In example embodiments, the second semiconductor chips 140 may be arranged on the edge portions of the upper surface of the interposer 120 at both sides of the first semiconductor chip 130 in two rows. Thus, numbers of the second semiconductor chips 140 may be four. However, numbers of the second semiconductor chips 140 may not be restricted within a specific number. For example, the semiconductor package 100 may include one, two, three or at least five second semiconductor chips 140. The four second semiconductor chips 140 may be arranged at corners of the upper surface of the interposer 120. The second semiconductor chips 140 may include memory chips. For example, the second semiconductor chips 140 may include high bandwidth memory (HBM) chips. Further, the second semiconductor chips 140 may have a structure including a plurality of the stacked memory chips.

Each of the second semiconductor chips 140 may have a rectangular parallelepiped shape having a size smaller than the size of the first semiconductor chip 130. Thus, each of the second semiconductor chips 140 may have first outer surfaces 142 extended in the first direction and second outer surfaces 144 extended in the second direction. Particularly, the first outer surfaces 142 of the second semiconductor chip 140 may be positioned on a vertical plane substantially coplanar with the vertical plane on which the first outer surfaces 122 of the interposer 120 may be positioned. Therefore, the first outer surfaces 142 of the second semiconductor chip 140 may be substantially coplanar with the first outer surfaces 132 of the first semiconductor chip 130. Alternatively, the first outer surfaces 142 of the second semiconductor chip 140 may be positioned further inside than the first outer surfaces 122 of the interposer 120. Further, the second outer surfaces 144 of the second semiconductor chip 140 may be substantially coplanar with the second outer surfaces of the interposer 120.

In contrast, an inner surface 146 of the second semiconductor chip 140 opposite to the second outer surface 144 may face the second outer surface 134 of the first semiconductor chip 130. Particularly, a gap may be formed between the inner surface 146 of the second semiconductor chip 140 and the second outer surface 134 of the first semiconductor chip 130.

Additionally, a dummy chip 148 may be arranged between the second semiconductor chips 140. A gap may be formed between the dummy chip 148 and the second semiconductor chips 140. The dummy chip 148 may be electrically isolated from the first semiconductor chip 130, the second semiconductor chips 140, the interposer 120 and the package substrate 110.

The molding member 150 may be configured to surround the outer surfaces of the interposer 120, the first semiconductor chip 130, the second semiconductor chips 140 and the dummy chip 148. In contrast, the molding member 150 may not be arranged on the upper surfaces of the first semiconductor chip 130, the second semiconductor chips 140 and the dummy chip 148. Thus, the upper surfaces of the first semiconductor chip 130, the second semiconductor chips 140 and the dummy chip 148 may be upwardly exposed. Additionally, a heat spreader may be arranged on the upper surfaces of the first semiconductor chip 130, the second semiconductor chips 140 and the dummy chip 148. The molding member 150 may include an epoxy molding compound (EMC).

In example embodiments, the molding member 150 may include a first molding portion 152, a second molding portion 154 and a third molding portion 156.

The first molding portion 152 may be configured to support the first outer surfaces 122 of the interposer 120, the first outer surfaces 132 of the first semiconductor chips 130 and the first outer surfaces 142 of the second semiconductor chips 140. The first molding portion 152 may be extended in the first direction to make contact with the first outer surfaces 122 of the interposer 120, the first outer surfaces 132 of the first semiconductor chip 130 and the first outer surfaces 142 of the second semiconductor chips 140. That is, the first molding portion 152 may have an inner surface configured to make contact with the first outer surfaces 122 of the interposer 120, the first outer surfaces of the first semiconductor chip 130 and the first outer surfaces 142 of the second semiconductor chips 140.

The second molding portion 154 may be extended from both ends of the first molding portion 152. Thus, the both ends of the first molding portion 152 may be connected with each other through the second molding portion 154. The second molding portion 154 may be configured to support the second outer surfaces of the interposer 120 and the second outer surfaces 144 of the second semiconductor chips 140. The second molding portion 154 may be extended in the second direction to make contact with the second outer surfaces of the interposer 120 and the second outer surfaces 144 of the second semiconductor chips 140. That is, the second molding portion 154 may have an inner surface configured to make contact with the second outer surfaces of the interposer 120 and the second outer surfaces 144 of the second semiconductor chips 140. Further, the inner surface of the second molding portion 144 may be configured to make contact with the outer surfaces of the dummy chip 148.

The third molding portion 156 may be configured to fill a space between the inner surface 146 of the second semiconductor chip 140 and the second outer surface 134 of the first semiconductor chip 130, and a space between the dummy chip 148 and the second semiconductor chips 140.

The third molding portion 156, which may be configured to fill the space between the inner surface 146 of the second semiconductor chip 140 and the second outer surface 134 of the first semiconductor chip 130 and the space between the dummy chip 148 and the second semiconductor chips 140, may have a narrow width. Thus, the third molding portion 156 between the inner surface 146 of the second semiconductor chip 140 and the second outer surface 134 of the first semiconductor chip 130 may have relatively weak strength. Thus, when the MIP is downwardly compressed to bond the MIP to the package substrate 110 at a high temperature, for example, about 300° C. such as a reflow process, a laser process, etc., the MIP may be bent with respect to an extending direction C of the third molding portion 156. For example, a central portion of the MIP may be upwardly bent. The upwardly bent central portion of the MIP may become remote from the package substrate 110. In contrast, an edge portion of the MIP may be closely adjacent to the package substrate 110. Therefore, the central first conductive bumps 170 may also become remote from the package substrate 110 so that the central first conductive bumps 170 may not be connected to the package substrate 110. Further, a gap between the edge first conductive bumps 170 may be narrowed to generate an electrical short between the edge first conductive bumps 170.

In order to prevent the above-mentioned problems, in one or more example embodiments, the first stiffener 160 may be configured to suppress the warpage of the MIP. The first stiffener 160 may be attached to any one of the outer surfaces of the MIP in the first direction, i.e., the outer surfaces of the molding member 150. Particularly, the first stiffener 160 may include a pair of stiffeners attached to outer surfaces 157 of the first molding member 152. The first stiffener 160 may reinforce strength of the MIP in the first direction to suppress the warpage of the MIP with respect to the third molding portion 156. In order to detach the first stiffener 160 from the outer surface of the molding member 150 during the attaching process, the first stiffener 160 may be attached to the outer surface of the molding member 150 using an adhesive 180 capable of maintaining an adhesion force at no less than about 300° C.

Particularly, the first stiffener 160 may be spaced apart from the upper surface of the package substrate 110. When the first stiffener 160 may be connected to the package substrate 110, the first stiffener 160 may be interlocked with the package substrate 110 so that the function of the first stiffener 160 for suppressing the warpage of the MIP may not be sufficiently shown. Thus, a lower end of the first stiffener 160 may be spaced apart from the upper surface of the package substrate 110 to form a gap between the lower end of the first stiffener 160 and the upper surface of the package substrate 110.

In order to provide the first stiffener 160 with the function for suppressing the warpage of the MIP, the first stiffener 160 may include a material having strength stronger than that of the MIP. Silicon of the first and second semiconductor chips 130 and 140 among the interposer 120, the first semiconductor chip 130, the second semiconductor chip 140 and the molding member 150 in the MIP may have the strongest strength so that the material of the first stiffener 160 may have the strength stronger than the strength of the silicon. For example, the first stiffener 160 may include a metal such as aluminum, copper, etc. To provide the first stiffener 160 with the strength stronger than that of the MIP, the material of the first stiffener 160 may be changed in accordance with the material of the MIP, and is not restricted within the above-mentioned metal.

In example embodiments, the first stiffener 160 may have a thickness substantially the same as a thickness of the MIP. That is, an upper end of the first stiffener 160 may be positioned on a horizontal plane substantially the same as a horizontal plane on which an upper surface of the first molding portion 152 may be positioned. The lower end of the first stiffener 160 may be positioned on a horizontal plane substantially the same as a horizontal plane on which a lower surface of the first molding portion 152 may be positioned. For example, when the thickness of the MIP may be about 0.883±0.03 mm, the thickness of the first stiffener 160 may also be about 0.883±0.03 mm.

Further, because the first stiffener 160 may suppress the warpage of the MIP with respect to the third molding portion 156, the first stiffener 160 may have a length of no less than a length of the first outer surface 132 of the first semiconductor chip 130 in the first direction. In example embodiments, the length of the first stiffener 160 may be a sum of the length of the first outer surface 132 of the first semiconductor chip 130 and lengths of the first outer surfaces 142 of the second semiconductor chips 140. That is, the length of the first stiffener 160 may be substantially the same as the length of the outer surface 157 of the first molding portion 152 in the first direction. Thus, the length of the first stiffener 160 may be set between the length of the first outer surface 132 of the first semiconductor chip 130 and the length of the outer surface 157 of the first molding portion 152.

A width of the first stiffener 160 in the second direction may be a half value of a width of the MIP subtracting from a width of the package substrate 110. Thus, the pair of the first stiffeners 160 may be configured to fully cover the edge portions of the upper surface of the package substrate 110 exposed by the MIP in the second direction. However, the width of the first stiffener 160 in the second direction may not be restricted within the above-mentioned specific value. For example, the width of the first stiffener 160 in the second direction may be below the half value of the width of the MIP subtracting from the width of the package substrate 110.

In example embodiments, the semiconductor package 100 may include the four second semiconductor chips 140, the lengths of the package substrate 110 in the first and second directions may be about 55 mm. The length of the MIP in the first direction may be about 44 mm and the length of the MIP in the second direction may be about 32 mm. In this case, the width of the first stiffener 160 in the second direction may be about 23 mm or below 23 mm.

However, the function of the first stiffener 160 may be shown by only attaching the first stiffener 160 to the outer surface 157 of the first molding portion 152. Therefore, the width, the thickness and the length of the first stiffener 160 may not be restricted within specific values.

Figure 4:
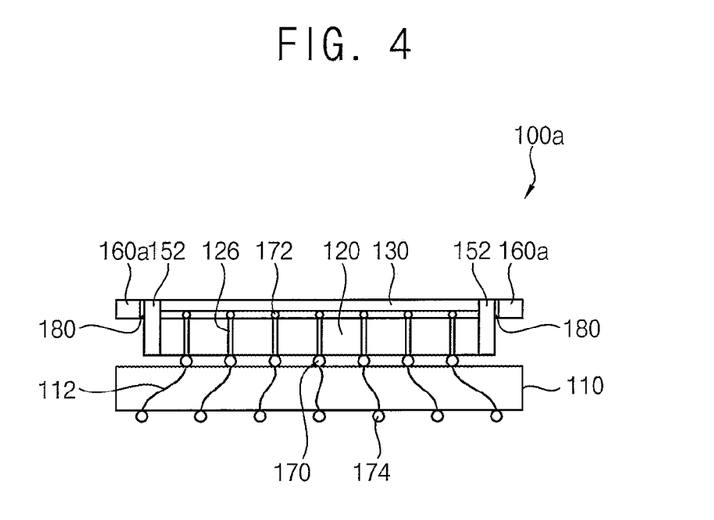
FIG. 4 is a perspective view illustrating a semiconductor package in accordance with example embodiments.

FIG. 4 is a perspective view illustrating a semiconductor package in accordance with example embodiments.

A semiconductor package 100a of this example embodiment may include elements substantially the same as those of the semiconductor package 100 in FIG. 3 except for a first stiffener. Thus, the same reference numerals may refer to the same elements and any further illustrations with respect to the same elements may be omitted herein for brevity.

Referring to FIG. 4, a first stiffener 160a may be attached to an upper portion of the outer surface of the MIP. The first stiffener 160a may have an upper end substantially coplanar with the upper surface of the MIP. In contrast, the first stiffener 160a may have a lower end higher than the lower surface of the MIP. Thus, the first stiffener 160a may have a thickness less than the thickness of the MIP, particularly the thickness of the first molding portion 152.

Figure 5:
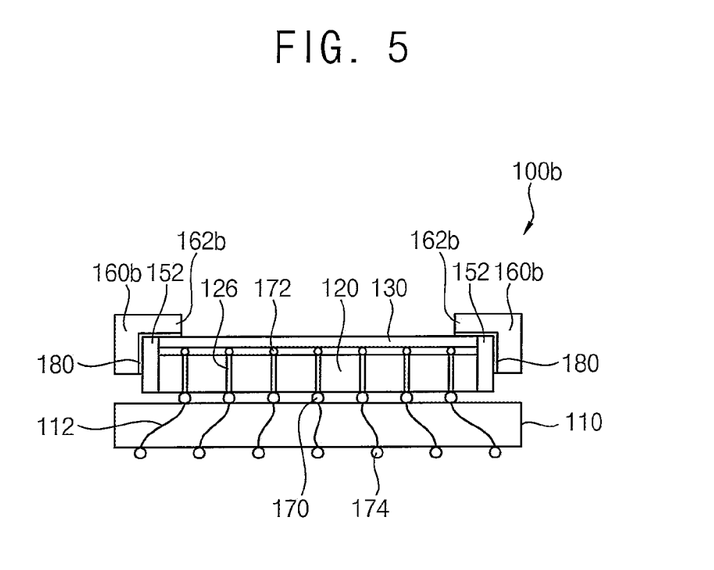
FIG. 5 is a perspective view illustrating a semiconductor package in accordance with example embodiments.

FIG. 5 is a perspective view illustrating a semiconductor package in accordance with example embodiments.

A semiconductor package 100b of this example embodiment may include elements substantially the same as those of the semiconductor package 100 in FIG. 3 except for a first stiffener. Thus, the same reference numerals may refer to the same elements and any further illustrations with respect to the same elements may be omitted herein for brevity.

Referring to FIG. 5, a first stiffener 160b may be attached to an upper portion and a middle portion of the outer surface of the MIP. The first stiffener 160b may have a lower end higher than the lower surface of the MIP. Further, the first stiffener 160b may include an upper reinforcing portion 162b configured to partially make contact with the upper surface of the MIP, particularly the upper surface of the first molding portion 152 to support the upper surface of the first molding portion 152. The first stiffener 160b may have an upper end higher than the upper surface of the MIP due to the upper reinforcing portion 162b.

Figure 6:
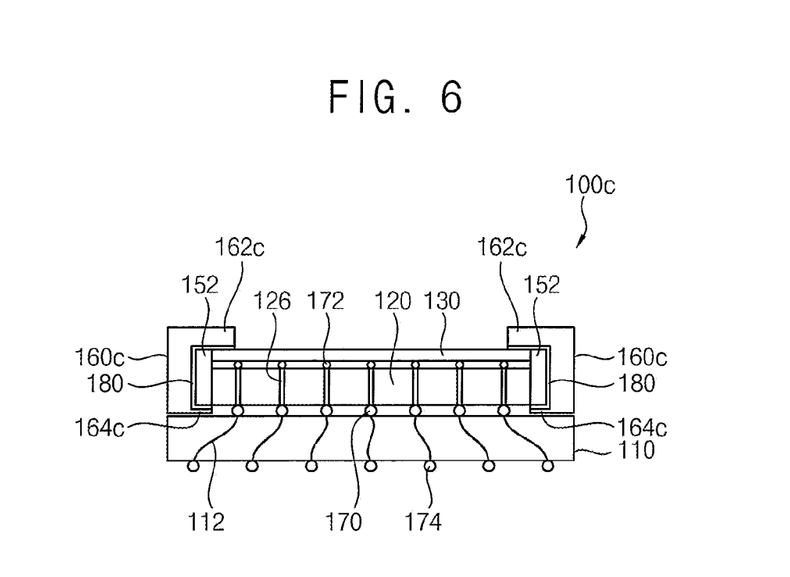
FIG. 6 is a perspective view illustrating a semiconductor package in accordance with example embodiments.

FIG. 6 is a perspective view illustrating a semiconductor package in accordance with example embodiments.

A semiconductor package 100c of this example embodiment may include elements substantially the same as those of the semiconductor package 100 in FIG. 3 except for a first stiffener. Thus, the same reference numerals may refer to the same elements and any further illustrations with respect to the same elements may be omitted herein for brevity.

Referring to FIG. 6, a first stiffener 160c may be attached to the entire outer surface of the MIP. The first stiffener 160c may include an upper reinforcing portion 162c configured to partially make contact with the upper surface of the MIP, particularly the upper surface of the first molding portion 152 to support the upper surface of the first molding portion 152. The first stiffener 160c may have an upper end higher than the upper surface of the MIP due to the upper reinforcing portion 162c.

Further, the first stiffener 160c may include a lower reinforcing portion 164c configured to partially make contact with the lower surface of the MIP, particularly the lower surface of the first molding portion 152 to support the lower surface of the first molding portion 152. The first stiffener 160c may have a lower end lower than the lower surface of the MIP due to the lower reinforcing portion 164c. However, the lower reinforcing portion 164c may be spaced apart from the upper surface of the package substrate 110, not make contact with the upper surface of the package substrate 110.

Figure 7:
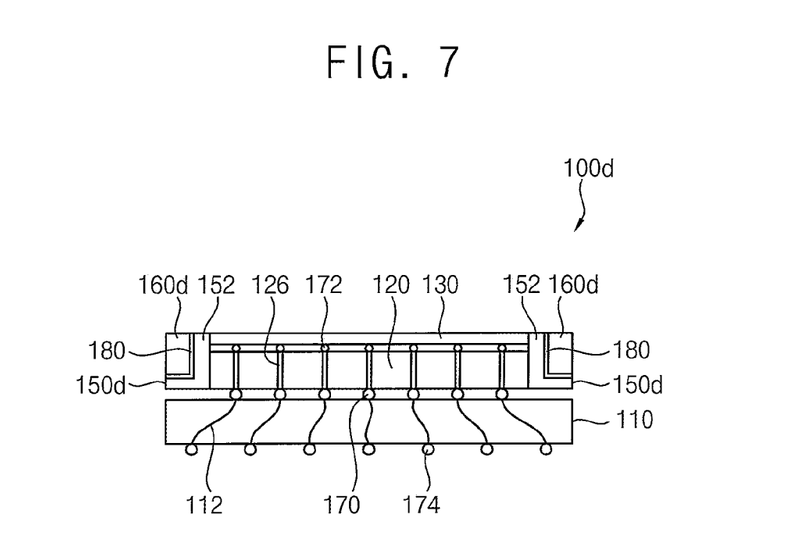
FIG. 7 is a perspective view illustrating a semiconductor package in accordance with example embodiments.

FIG. 7 is a perspective view illustrating a semiconductor package in accordance with example embodiments.

A semiconductor package 100d of this example embodiment may include elements substantially the same as those of the semiconductor package 100 in FIG. 3 except for a molding member and a first stiffener. Thus, the same reference numerals may refer to the same elements and any further illustrations with respect to the same elements may be omitted herein for brevity.

Referring to FIG. 7, a molding member 150 may include a supporting portion 150d horizontally extended from a lower portion of the outer surface of each of the first molding portions 152. The supporting portion 150d may be configured to support the lower end of the first stiffener 160d.

Because the supporting portion 150d may support the lower end of the first stiffener 160d, the first stiffener 160d may have a thickness slightly less than the thickness of the first molding portion 152. In contrast, the first stiffener 160d may have an upper end substantially coplanar with the upper surface of the first molding portion 152.

Figure 8:
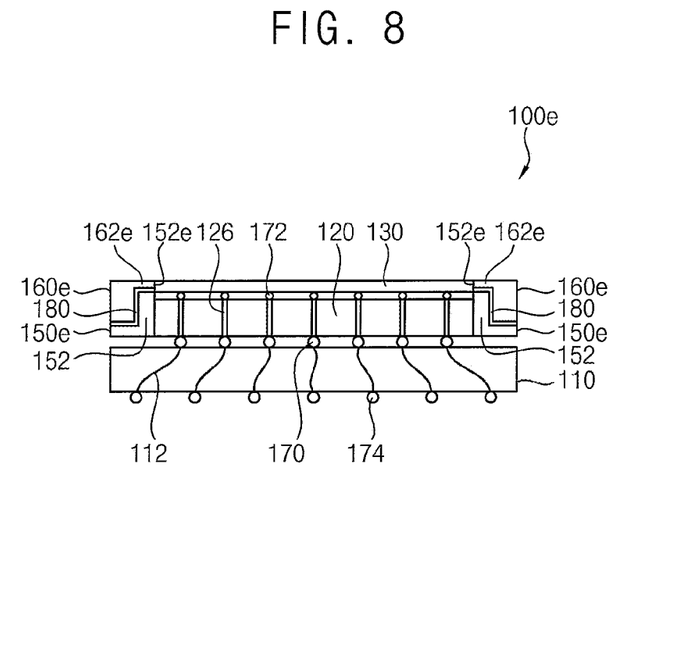
FIG. 8 is a perspective view illustrating a semiconductor package in accordance with example embodiments.

FIG. 8 is a perspective view illustrating a semiconductor package in accordance with example embodiments.

A semiconductor package 100e of this example embodiment may include elements substantially the same as those of the semiconductor package 100 in FIG. 3 except for a molding member and a first stiffener. Thus, the same reference numerals may refer to the same elements and any further illustrations with respect to the same elements may be omitted herein for brevity.

Referring to FIG. 8, a molding member 150 may include a supporting step 150e horizontally extended from a lower portion of the outer surface of each of the first molding portions 152, and an upper receiving groove 152e formed at an upper portion of the outer surface of each of the first molding portions 152.

The supporting step 150e may be configured to support the lower end of the first stiffener 160d. The first stiffener 160e may include an upper reinforcing step 162e extended from an upper portion of an inner surface of the first stiffener 160e. The upper reinforcing step 162e may be inserted into the upper receiving groove 152e. Because the supporting portion 150e may support the lower end of the first stiffener 160e, the first stiffener 160e may have a thickness slightly less than the thickness of the first molding portion 152. In contrast, the first stiffener 160e may have an upper end substantially coplanar with the upper surface of the first molding portion 152.

Figure 9:
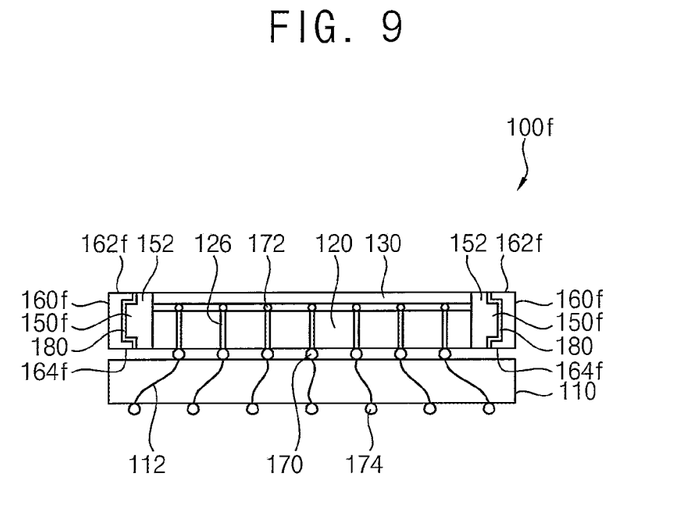
FIG. 9 is a perspective view illustrating a semiconductor package in accordance with example embodiments.

FIG. 9 is a perspective view illustrating a semiconductor package in accordance with example embodiments.

A semiconductor package 100f of this example embodiment may include elements substantially the same as those of the semiconductor package 100 in FIG. 3 except for a molding member and a first stiffener. Thus, the same reference numerals may refer to the same elements and any further illustrations with respect to the same elements may be omitted herein for brevity.

Referring to FIG. 9, a molding member 150 may include a protrusion 150f horizontally extended from a central portion of the outer surface of each of the first molding portions 152. By forming the protrusion 150f, an upper receiving groove may be formed over the protrusion 150f and a lower receiving groove may be formed under the protrusion 150f.

The first stiffener 160f may include an upper reinforcing step 162f extended from an upper portion of an inner surface of the first stiffener 160f, and a lower reinforcing step 164f extended from a lower portion of the inner surface of the first stiffener 160f. The upper reinforcing step 162f may be inserted into the upper receiving groove. The lower reinforcing step 164f may be inserted into the lower receiving groove. The first stiffener 160f may have an upper end substantially coplanar with the upper surface of the first molding portion 152. The first stiffener 160f may have a lower end substantially coplanar with the lower surface of the first molding portion 152.

Figure 10:
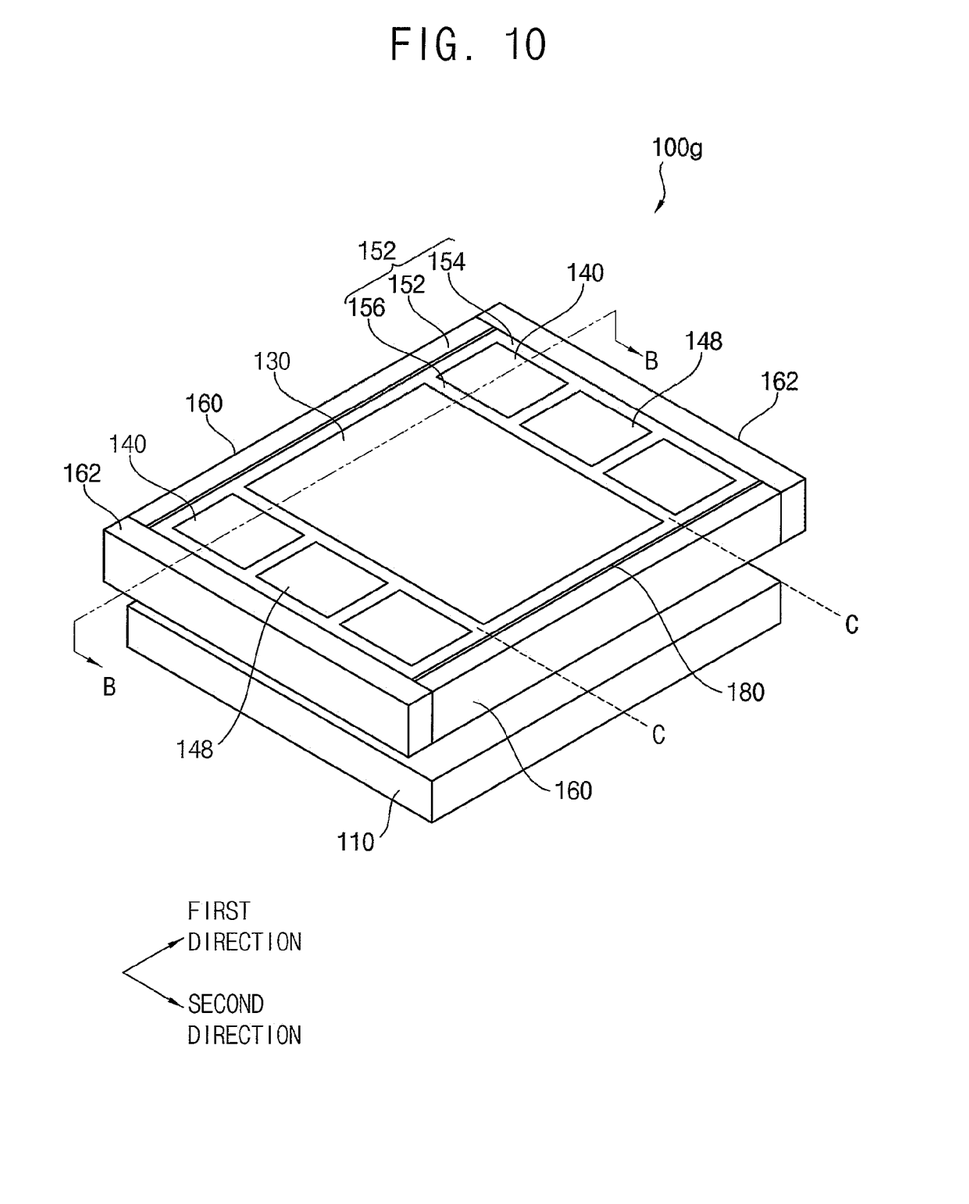
FIG. 10 is a perspective view illustrating a semiconductor package in accordance with example embodiments.
Figure 11:
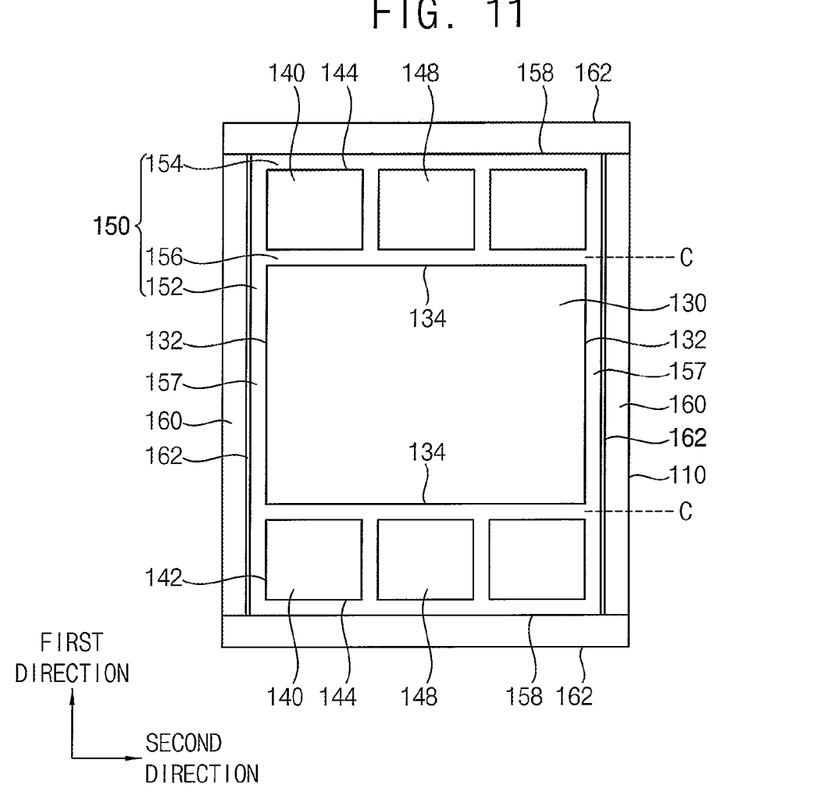
FIG. 11 is a plan view illustrating the semiconductor package in FIG. 10.
Figure 12:
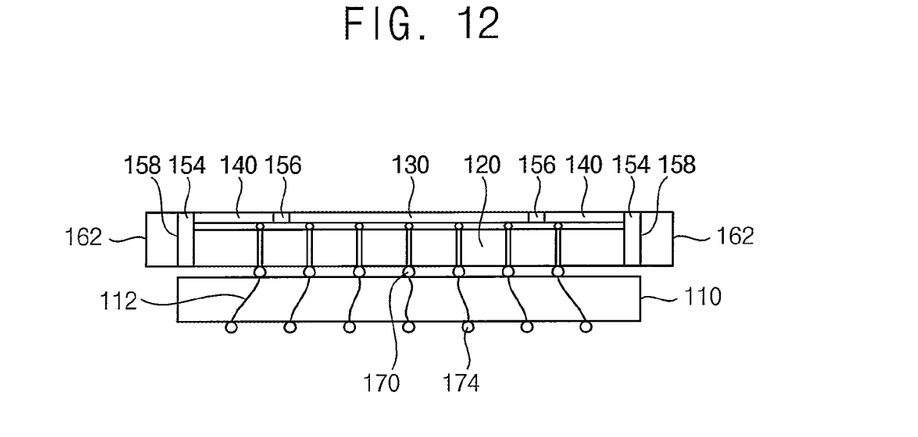
FIG. 12 is a cross-sectional view taken along a line B-B' in FIG. 10.

FIG. 10 is a perspective view illustrating a semiconductor package in accordance with example embodiments, FIG. 11 is a plan view illustrating the semiconductor package in FIG. 10, and FIG. 12 is a cross-sectional view taken along a line B-B' in FIG. 10.

A semiconductor package 100g of this example embodiment may include elements substantially the same as those of the semiconductor package 100 in FIG. 1 except for further including a second stiffener. Thus, the same reference numerals may refer to the same elements and any further illustrations with respect to the same elements may be omitted herein for brevity.

Referring to FIGS. 10 to 12, a second stiffener 162 may be configured to suppress the wafer page of the MIP in the second direction. The second stiffener 162 may be attached to any one of the outer surfaces of the MIP in the second direction, i.e., the outer surfaces of the molding member 150. Particularly, the second stiffener 162 may include a pair of stiffeners attached to outer surfaces of the second molding member 154. The second stiffener 162 may reinforce strength of the MIP in the second direction to suppress the warpage of the MIP. In order to detach the second stiffener 162 from the outer surface of the molding member 150 during the attaching process, the second stiffener 162 may be attached to the outer surface of the molding member 150 using the adhesive 180 capable of maintaining an adhesion force at no less than about 300° C.

Particularly, similarly to the first stiffener 160, the second stiffener 162 may be spaced apart from the upper surface of the package substrate 110. Thus, a lower end of the second stiffener 162 may be spaced apart from the upper surface of the package substrate 110 to form a gap between the lower end of the second stiffener 162 and the upper surface of the package substrate 110.

The second stiffener 162 may include a material substantially the same as the material of the first stiffener 160. Thus, any further illustrations with respect to the material of the second stiffener 162 may be omitted herein for brevity.

The second stiffener 162 may have a length substantially the same as the length of the outer surface 158 of the second molding portion 154 in the second direction. In this case, the second stiffener 162 may not be connected to the first stiffener 160. Alternatively, the second stiffener 162 may have a length for connecting the both ends of the pair of the first stiffeners 160.

The function of the second stiffener 162 may be shown by only attaching the second stiffener 162 to the outer surface 158 of the second molding portion 154. Therefore, the width, the thickness and the length of the second stiffener 162 may not be restricted within specific values.

Alternatively, the second stiffener 162 may have the structure of the first stiffener 160a in FIG. 4, the structure of the first stiffener 160b in FIG. 5, the structure of the first stiffener 160c in FIG. 6, the structure of the first stiffener 160d in FIG. 7, the structure of the first stiffener 160e in FIG. 8, or the structure of the first stiffener 160f in FIG. 9.

According to example embodiments, the first stiffener may be attached to facing side surfaces of the molding member and spaced apart from the upper surface of the package substrate to suppress the warpage of the MIP with respect to the third molding portion in a process for bonding the MIP to the package substrate at a high temperature. Thus, central conductive bumps between the MIP and the package substrate may not be upwardly floated to improve an electrical connection between the central conductive bumps and the package substrate. Further, a short between edge conductive bumps between the MIP and the package substrate may not be generated.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor package comprising:
   a package substrate;
   an interposer on an upper surface of the package substrate;
   at least one application specific integrated circuit (ASIC) chip on at least a central portion of an upper surface of the interposer;
   a plurality of memory chips on at least edge portions of the upper surface of the interposer at both sides of the ASIC chip in a first direction;
   a molding member including first molding portions, second molding portions and third molding portions, the first molding portions extending in the first direction to contact first outer surfaces of the ASIC chip, the memory chips and the interposer, the second molding portions extending from ends of the first molding portions in a second direction substantially perpendicular to the first direction to contact second outer surfaces of the memory chips and the interposer, and the third molding portions extending between the ASIC chip and the memory chips; and
   first stiffeners attached to an outer surface of the first molding portions and spaced apart from the upper surface of the package substrate, the first stiffeners configured to suppress a warpage of the ASIC chip, the memory chips and the molding member along the first direction with respect to the third molding portions,
   wherein each of the first stiffeners has a length in the first direction substantially same as a length of the outer surface of the first molding portions, a length in the second direction substantially same as a length of the package substrate exposed from the ASIC chip and the molding member, and a thickness substantially same as a thickness of the molding member.

2. The semiconductor package of claim 1, wherein each of the first stiffeners comprises:
   an upper reinforcing portion extending from an upper end of the first stiffener to support an upper surface of the first molding portion; and
   a lower reinforcing portion extending from a lower end of the first stiffener to support a lower surface of the first molding portion.

3. The semiconductor package of claim 1, wherein
   the molding member includes a supporting step and an upper receiving grove, the supporting step horizontally extending from a lower portion of the outer surface of each of the first molding portions to support a lower end of respective ones of the first stiffeners, and the upper receiving groove formed at an upper portion of the outer surface of each of the first molding portions, and
   the first stiffeners each include an upper reinforcing step extending from an upper portion of an inner surface of the first stiffener into the upper receiving groove.

4. The semiconductor package of claim 1, wherein
   the molding member includes a protrusion at a central portion of the outer surface of each of the first molding portions to form an upper receiving groove over the protrusion and a lower receiving groove under the protrusion, and
   the first stiffeners each include an upper reinforcing step and a lower reinforcing step, the upper reinforcing step extending from an upper portion of an inner surface of the first stiffener into the upper receiving groove, and the lower reinforcing step extending from a lower portion of the inner surface of the first stiffener into the lower receiving groove.

5. A semiconductor package comprising:
   a package substrate;
   an interposer on an upper surface of the package substrate;
   at least one first semiconductor chip on at least a central portion of an upper surface of the interposer;
   a plurality of second semiconductor chips on at least edge portions of the upper surface of the interposer at both sides of the first semiconductor chip in a first direction;
   a molding member including first molding portions, second molding portions and third molding portions, the first molding portions extending in the first direction to contact first outer surfaces of the first semiconductor chip, the second semiconductor chips and the interposer, the second molding portions extending from ends of the first molding portions in a second direction substantially perpendicular to the first direction to contact second outer surfaces of the second semiconductor chips and the interposer, and the third molding portions extending between the first semiconductor chip and the plurality of second semiconductor chips; and
   first stiffeners attached to outer surfaces of the first molding portions and spaced apart from the upper surface of the package substrate, the first stiffeners including a material having a strength stronger than strengths of the first and second semiconductor chips such that the first stiffeners are configured to suppress a warpage of the first semiconductor chip, the second semiconductor chips and the molding member along the first direction with respect to the third molding portions.

6. The semiconductor package of claim 5, wherein each of the first stiffeners has a length in the first direction substantially same as a length of the outer surface of the first molding portions.

7. The semiconductor package of claim 5, wherein the first stiffeners comprises aluminum.

8. The semiconductor package of claim 5, wherein each of the first stiffeners comprises:
an upper reinforcing portion extending from an upper end of the first stiffener to support an upper surface of the first molding portion; and
a lower reinforcing portion extending from a lower end of the first stiffener to support a lower surface of the first molding portion.

9. The semiconductor package of claim 5, wherein
the molding member includes a supporting step and an upper receiving groove, the supporting step horizontally extending from a lower portion of the outer surface of each of the first molding portions to support a lower end of each of the first stiffeners, and the upper receiving groove being at an upper portion of the outer surface of each of the first molding portions, and
the first stiffeners each include an upper reinforcing step extending from an upper portion of an inner surface of the first stiffener into the upper receiving groove.

10. The semiconductor package of claim 5, wherein
the molding member includes a protrusion at a central portion of the outer surface of each of the first molding portions to form an upper receiving groove over the protrusion and a lower receiving groove under the protrusion, and
the first stiffeners each include an upper reinforcing step and a lower reinforcing step, the upper reinforcing step extending from an upper portion of an inner surface of the first stiffener into the upper receiving groove, and the lower reinforcing step extending from a lower portion of the inner surface of the first stiffener into the lower receiving groove.

11. A semiconductor package comprising:
a package substrate;
a molded interposer package (MIP) on the package substrate, the MIP including an interposer, at least one first semiconductor chip and at least one second semiconductor chip molded by a molding member; and
a first stiffener attached to at least one of outer surfaces of the MIP and spaced apart from an upper surface of the package substrate such that the first stiffener is configured to suppress a warpage of the MIP.

12. The semiconductor package of claim 11, wherein the first stiffener comprises:
a metal having a strength stronger than strengths of the first and second semiconductor chips.

13. The semiconductor package of claim 11, wherein a thickness of the first stiffener is less than or equal to a thickness of the molding member.

14. The semiconductor package of claim 11, wherein the MIP comprises:
the interposer on an upper surface of the package substrate;
the at least one first semiconductor chip on an upper surface of the interposer;
the at least one second semiconductor chip on the upper surface of the interposer; and
the molding member configured to surround side surfaces of the interposer, the at least one first semiconductor chip and the at least one second semiconductor chip.

15. The semiconductor package of claim 14, wherein the molding member comprises:
first molding portions extending in a first direction to contact first outer surfaces of the first semiconductor chip, the second semiconductor chip and the interposer;
second molding portion extending from ends of the first molding portions in a second direction substantially perpendicular to the first direction to contact second outer surfaces of the second semiconductor chip and the interposer; and
third molding portions extending between the first semiconductor chip and the at least one second semiconductor chip.

16. The semiconductor package of claim 15, wherein the first stiffener comprises:
a pair of first stiffeners attached to outer surfaces of the first molding portions, such that lengths of each of the pair of first stiffeners in the first direction are substantially same as a length of the outer surface of the first molding portions in the first direction.

17. The semiconductor package of claim 16, wherein the pair of first stiffeners each comprise:
an upper reinforcing portion extending from an upper end of respective ones of the pair of first stiffeners to support an upper surface of the first molding portion; and
a lower reinforcing portion extending from a lower end of respective ones of the pair of first stiffeners to support a lower surface of the first molding portion.

18. The semiconductor package of claim 15, wherein
the molding member includes a supporting step and an upper receiving groove, the supporting step horizontally extending from a lower portion of the outer surface of the first molding portions to support a lower end of the first stiffener, and the upper receiving groove being at an upper portion of the outer surface of each of the first molding portions, and
the first stiffener includes an upper reinforcing step extending from an upper portion of an inner surface of the first stiffener into the upper receiving groove.

19. The semiconductor package of claim 15, wherein
the molding member includes a protrusion at a central portion of the outer surface of each of the first molding portions to form an upper receiving groove over the protrusion and a lower receiving groove under the protrusion, and
the first stiffener includes an upper reinforcing step and a lower reinforcing step, the upper reinforcing step extending from an upper portion of an inner surface of the first stiffener into the upper receiving groove, and the lower reinforcing step extending from a lower portion of the inner surface of the first stiffener into the lower receiving groove.

20. The semiconductor package of claim 15, further comprising:
a second stiffener attached to outer surfaces of the second molding portions and spaced apart from the upper surface of the package substrate such that the second stiffener is configured to suppress a warpage of the first and second semiconductor chips along the second direction.

* * * * *